United States Patent
Tanaka et al.

(10) Patent No.: US 6,420,815 B1
(45) Date of Patent: Jul. 16, 2002

(54) SUBSTRATE FOR SURFACE ACOUSTIC WAVE DEVICE AND SURFACE ACOUSTIC WAVE DEVICE

(75) Inventors: Naoki Tanaka, Sakai; Morio Ogura, Hirakata, both of (JP)

(73) Assignee: Sanyo Electric Co., Ltd., Moriguchi (JP)

(*) Notice: Subject to any disclaimer, the term of this patent is extended or adjusted under 35 U.S.C. 154(b) by 0 days.

(21) Appl. No.: 09/662,766

(22) Filed: Sep. 15, 2000

(30) Foreign Application Priority Data

Sep. 16, 1999 (JP) ............................. 11-261790
Sep. 17, 1999 (JP) ............................. 11-263762

(51) Int. Cl.⁷ .................... H03H 9/25; H01L 41/107
(52) U.S. Cl. .................................... 310/313 A
(58) Field of Search ...................... 310/313 A, 313 R

(56) References Cited

U.S. PATENT DOCUMENTS 4,480,209 A * 10/1984 Okamoto et al. ......... 310/313 B
5,698,927 A * 12/1997 Tanaka et al. ........... 310/313 A
5,773,911 A * 6/1998 Tanaka et al. ........... 310/313 B
5,854,527 A * 12/1998 Shimizu et al. .......... 310/313 A
5,998,907 A * 12/1999 Taguchi et al. .......... 310/313 R
6,037,699 A * 3/2000 Kobayashi et al. ....... 310/313 A

FOREIGN PATENT DOCUMENTS

JP      6-112763 A   *  4/1994  ............. 310/313 A
JP      8-125488 A   *  5/1996  ............. 310/313 A
WO    WO-97/33368    *  9/1997  ........... 310/313 ALT

* cited by examiner

*Primary Examiner*—Thomas M. Dougherty
(74) *Attorney, Agent, or Firm*—Armstrong, Westerman & Hattori, LLP

(57) ABSTRACT

An SAW device substrate and an SAW device having a larger value of $K^2$ than conventional SAW device substrates can be obtained by using $LiNbO_3$ represented by Eulerian angles of (18–30°, 80–100°, 35–75°) and determining the thickness H of a piezoelectric substrate and the pitch $\lambda$ of electrodes so that KH is at least 2.3 and at most 4.5. Alternatively, an $Li_2B_4O_7$ layer is formed as a piezoelectric substrate on a surface of a glass layer to obtain an $Li_2B_4O_7$/glass structured SAW device substrate. More preferably, such $Li_2B_4O_7$ that is represented by Eulerian angles of (0–45°, 85–95°, 85–95°) is employed. Furthermore, the SAW device substrate is used to form an SAW device so that the KH parameter is about 0.5.

9 Claims, 17 Drawing Sheets

SURFACE ACOUSTIC WAVE OUTPUT
AT SYNCHRONOUS FREQUENCY

SUBSTRATE FOR SURFACE ACOUSTIC WAVE DEVICE AND SURFACE ACOUSTIC WAVE DEVICE

BACKGROUND OF THE INVENTION

1. Field of the Invention

The present invention relates to a surface acoustic wave (SAW) device.

2. Description of the Background Art

For example, the SAW devices include an SAW resonator, a transversal type SAW filter and a resonator type SAW filter which are selectively used according to application. In the following, an SAW filter, for example, as one of the SAW devices will be described.

FIG. 28 is a perspective view schematically showing the structure of an SAW filter. Referring to FIG. 28, the basic structure of the SAW filter 15 is a four-terminal structure which has a piezoelectric substrate 12 and a pair of comb-shaped electrodes 13 for surface wave excitation and reception formed on a surface of piezoelectric substrate 12. This type of electrode 13 is called an interdigital electrode, and this type of a transduction element is called an IDT (interdigital transducer).

In general, when an impulse voltage is applied to comb-shaped electrode 13 for oscillation, the piezoelectric effect causes opposite phase strain between adjacent electrodes 13 as shown in FIG. 29, and an SAW is excited. The SAW propagates on the surface of piezoelectric substrate 12. A surface electric charge is caused on piezoelectric substrate 12 by the strain, which is brought about by the surface wave, and extracted as an electric signal by comb-shaped electrode 13 for reception.

Conventionally, an SAW device such as SAW filter 15 has a structure in which an electrode corresponding to each device is arranged on the surface of piezoelectric substrate 12 as shown in FIG. 30. The characteristics of SAW device 15 largely depend on those of piezoelectric substrate 12, and piezoelectric substrate 12 is also selectively used according to application. Table 1 indicates typical materials for piezoelectric substrate 12 and the characteristics of an SAW which piezoelectric substrate 12.

TABLE 1

Various Characteristics of Typical SAW Device Substrates

| substrate | Eulerian angles $\phi, \theta, \psi$ | propagation velocity [m/s] | $K^2$ [%] | TCD [ppm/°C.] | propagation mode |
|---|---|---|---|---|---|
| crystal | 0°, 132.75°, 0° | 3159 | 0.12 | 0 | Rayleigh wave |
|  | 0°, 15°, 0° | 3948 | 0.11 | 0 | leaky wave |
| LiTaO$_3$ | 90°, 90°, 112° | 3328 | 1.0 | 23.3 | Rayleigh wave |
|  | 0°, 126°, 0° | 4211 | 4.7 | 45.1 | leaky wave |
| Li$_2$B$_4$O$_7$ | 45°, 90°, 90° | 3465 | 0.80 | -8.2 | Rayleigh wave |
|  | 0°, 75°, 75° | 4120 | 1.6 | -1.5 | leaky wave |
| LiNbO$_3$ | 0°, 38°, 0° | 4007 | 5.2 | 71.4 | Rayleigh wave |
|  | 0°, 154°, 0° | 4731 | 10.9 | 61.3 | leaky wave |

As can be seen from Table 1, the crystal substrate has low and superior temperature characteristics but it has small electro-mechanical coupling coefficients ($K^2$). Conventionally, a 128° Y-X LN substrate (expressed by Eulerian angles of (0°, 38°, 0°) LN) is generally used for an LiNbO$_3$ (LN) substrate. However, the conventional LN substrate has large values of $K^2$ but it has inferior temperature characteristics such as a temperature coefficient of delaytime (TCD). On the other hand, the Li$_2$B$_4$O$_7$ substrate has intermediate characteristics between those of the crystal substrate and the LN substrate.

As described above, each substrate has both advantageous and disadvantageous points and is selectively used according to application of the device. In recent years, video devices such as a TV and telecommunication devices such as a mobile phone have been developed, and therefore SAW devices used therefor need to have characteristics superior than ever.

Here, the Eulerian angles in Table 1 will be described with reference to FIG. 31.

Referring to FIG. 31, the Z axis is first used as a rotational axis to rotate the X axis in the Y axis direction by $\phi$ so as to provide a first axis. Then, the first axis is used as a rotational axis to rotate the Z axis counterclockwise by $\theta$ so as to provide a second axis. A substrate is obtained by cutting a substrate material at a plane orientation such that the second axis is normal to the plane and the first axis is on the plane. In the substrate which is cut at the orientation, the second axis is used as a rotational axis to rotate the first axis counterclockwise by $\psi$ to provide a third axis. The third axis is employed as an SAW propagation direction. It is noted that an axis perpendicular to the third axis on the plane is a fourth axis. In this manner, the Eulerian angles ($\phi, \theta, \psi$) are defined.

Recently, attaining smaller SAW devices have been requested. It is considered in general that a device with a large bandwidth can be designed more easily as the value of $K^2$ of a piezoelectric substrate is higher. Furthermore, a substrate with a large value of $K^2$ makes it possible to reduce the number of electrodes, and it is advantageous for providing a smaller SAW device. Conventionally, however, $K^2$ is a value inherent in a substrate material although it more or less increases or decreases with Eulerian angles employed. Conventionally, it is therefore necessary to begin with the development of a substrate material in order to obtain an SAW device substrate having a large value of $K^2$. If this can be achieved by using conventional materials, that can greatly contribute to the technical field.

Here, the center frequency $f_O$ of an SAW device is determined by $f_O = V/\lambda$ (V: the propagation velocity of a surface acoustic wave, $\lambda$: the electrode pitch of an IDT). Therefore, if the Li$_2$B$_4$O$_7$ substrate having a higher propagation velocity V than that of a crystal substrate or the like is simply used for manufacturing a device having the same center frequency $f_O$, the electrode pitch $\lambda$ of the IDT needs to be increased and, as a result, the SAW device itself has to be made larger. In short, a substrate with a lower propagation velocity V is advantageous for attaining a smaller SAW device itself.

Therefore, the present invention aims to attaining a smaller SAW device as a common object. For the purpose, the present invention has a first object of obtaining, by using a conventional material, an SAW device substrate which has larger $K^2$ advantageous for attaining a smaller and higher performance SAW device, and a second object of obtaining an SAW device substrate which has intermediate $K^2$ between those of a crystal substrate and an LN substrate and has a low propagation velocity advantageous for attaining a smaller SAW device.

SUMMARY OF THE INVENTION

The inventors conducted an extensive study based on the above objects and found out that larger $K^2$ can be obtained by setting Eulerian angles and the value of KH in prescribed ranges, wherein K is a value found by dividing 2π by an electrode pitch, H is a piezoelectric substrate thickness, and KH is a product of K and H. In the present invention, the above object is attained by forming LN, which is expressed as (18–30°, 80–100°, 35–75°) in terms of Eulerian angles, on a glass surface so as to provide a (18–30°, 80–100°, 35–75°) LN/glass structure substrate.

In the (18–30°, 80–100°, 35–75°) LN/glass structure substrate, it is more preferable that much higher $K^2$ can be obtained by setting a KH parameter so that $2.8 \leq KH \leq 3.8$.

In the present invention, the above described objects are also achieved by forming an $Li_2B_4O_7$ layer on a glass surface to obtain an $Li_2B_4O_7$/glass structure substrate. More preferably, such $Li_2B_4O_7$ that is expressed as (0–45°, 85–95°, 85–95°) in terms of Eulerian angles is used in the $Li_2B_4O_7$/glass structure substrate. More preferably, the KH parameter is set at about 0.5 to obtain an SAW device substrate having a lower propagation velocity.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, embodiments of the present invention will be described with reference to the drawings.

First Embodiment

Figure 1:
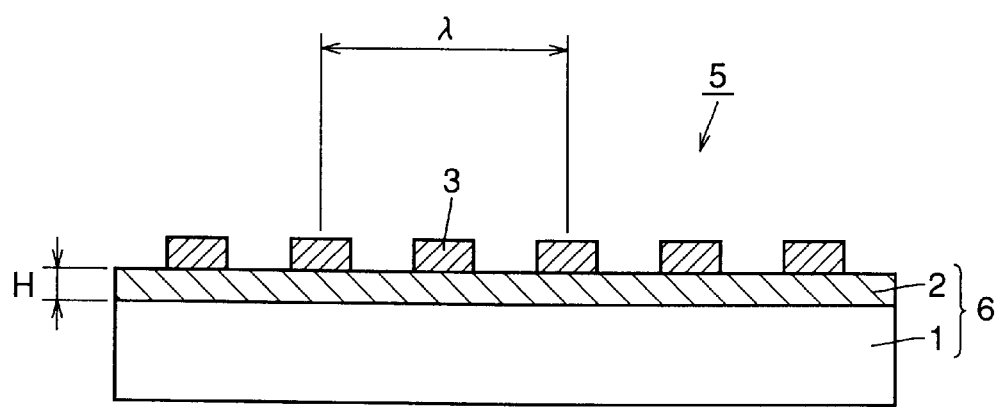
FIG. 1 is a schematic sectional view showing the structure of an SAW device in an embodiment of the present invention.

A schematic sectional view showing the structure of an SAW device in a first embodiment of the present invention is shown in FIG. 1. An SAW device 5 has a glass substrate 1, a piezoelectric substrate 2 and an electrode 3. Piezoelectric substrate 2 is formed on glass substrate 1 and is made of LN. On piezoelectric substrate 2 is formed electrode 3 which has an arrangement according to the device. It is noted that a portion formed of glass substrate 1 and piezoelectric substrate 2 is called a substrate for the SAW device (hereinafter, referred to as an SAW device substrate) 6.

Such an SAW device 5 can be obtained by bonding an LN substrate as piezoelectric substrate 2 onto a surface of glass substrate 1 or forming an LN thin film as piezoelectric substrate 2 on the surface of glass substrate 1 and, thereafter, forming and patterning electrode 3 on the LN substrate or the LN thin film.

Glass substrate 1 may be made of a material such as quartz glass, aluminosilicate glass, borosilicate glass, soda lime glass and lead silicate glass. The substrate to be combined with the LN substrate is not limited to a glass substrate, and it may be any material causing a lower sound speed than LN and having an opposite sign characteristic from those of TCD and TCV (temperature coefficients of sound speed) of LN.

Piezoelectric substrate 2 may be made only of LN or may partially contain LN. The material for electrode 3 may be aluminum, for example, although not exclusive.

As shown in FIG. 1, the thickness of piezoelectric substrate 2 is H, the pitch of electrodes 3 is $\lambda$, and K is $2\pi/\lambda$. The following description will be provided by paying attention to the Eulerian angles of LN included in piezoelectric substrate 2 as well as KH which is a product of K and H.

Figure 2:
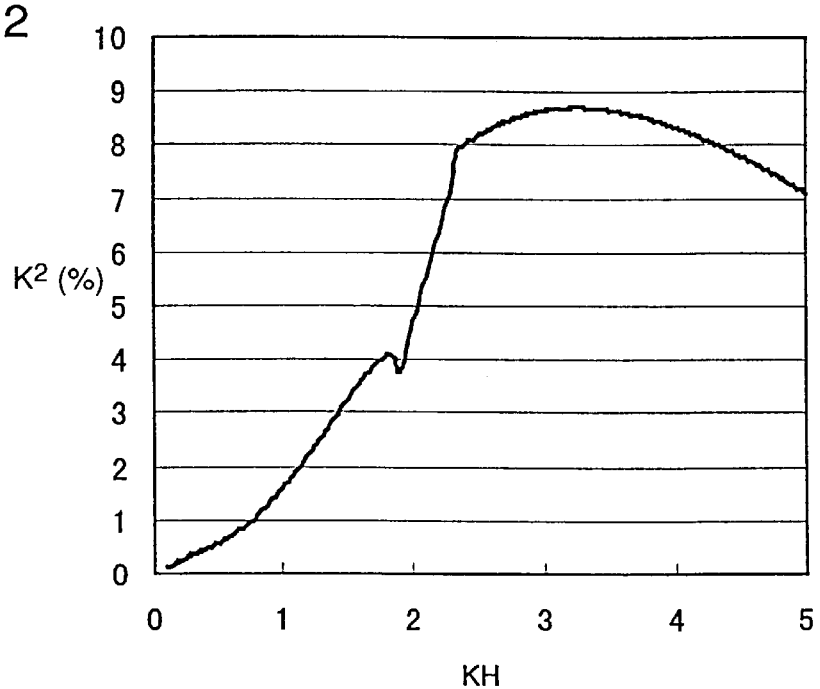
FIG. 2 illustrates the dependence of $K^2$ of a (30°, 90°, 60°) LN/glass structure substrate on KH.

FIG. 2 illustrates the result of calculating $K^2$ in a (30°, 90°, 60°) LN/glass structure substrate. The calculation is performed by using KH as a parameter and employing the Campbell and Jones method. As can be seen from FIG. 2, the value of $K^2$ depends on the value of KH. It is also found out that $K^2$ has the maximum value when KH is 3.3.

Figure 3:
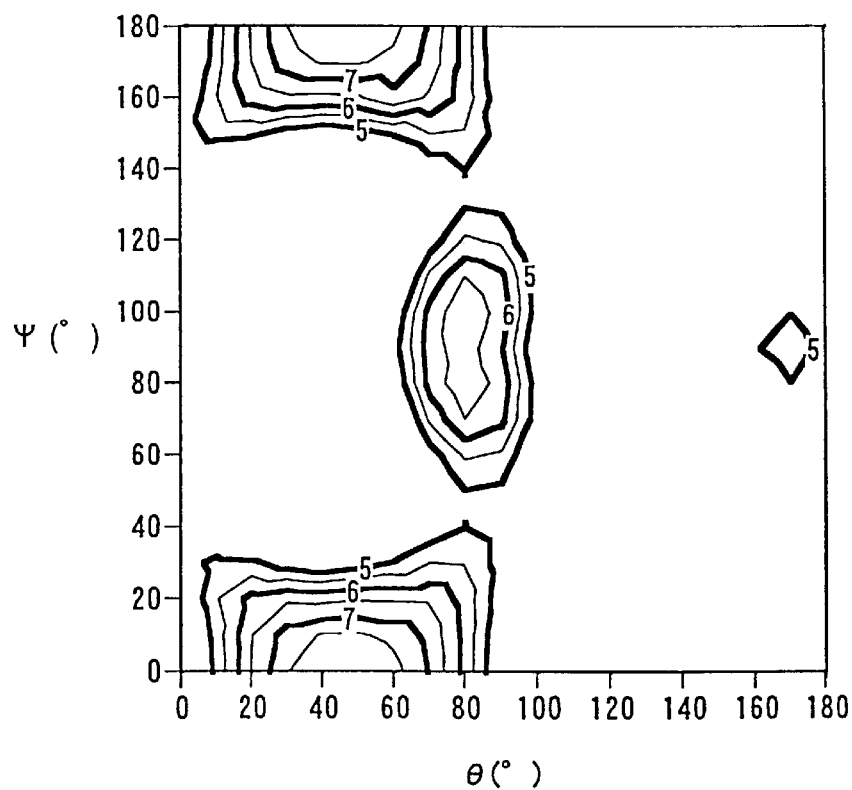
FIG. 3 is a graph illustrating the calculation result of $K^2$ of a (0°, θ, ψ) LN/glass structure substrate for KH which provides the maximum $K^2$.
Figure 4:
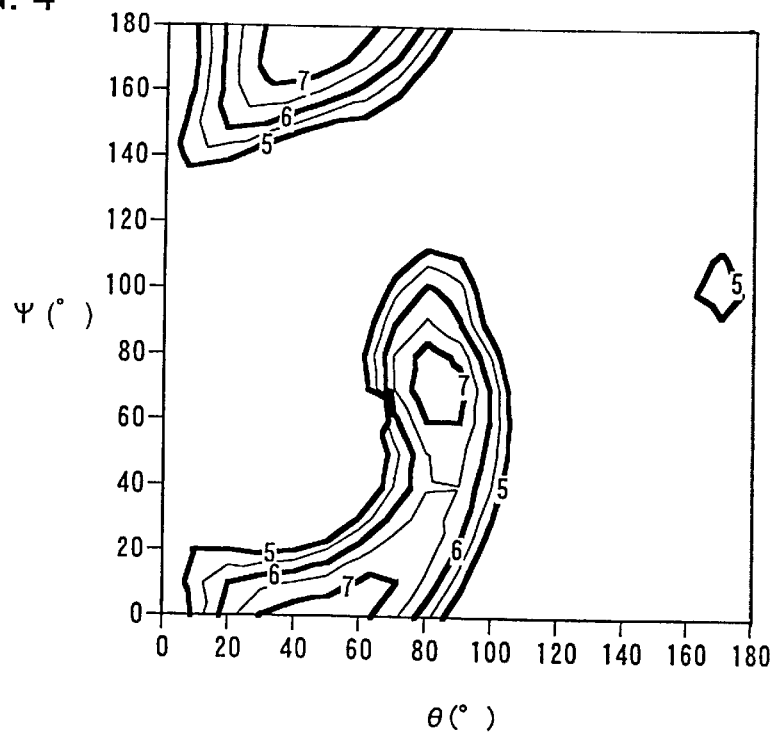
FIG. 4 is a graph illustrating the calculation result of $K^2$ of a (10°, θ, ψ) LN/glass structure substrate for KH which provides the maximum $K^2$.
Figure 5:
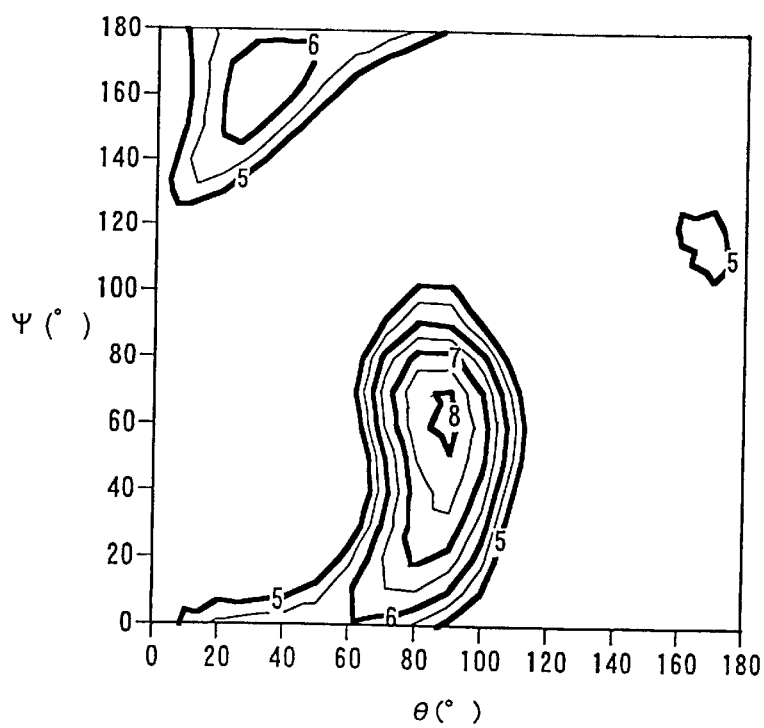
FIG. 5 is a graph illustrating the calculation result of $K^2$ of a (20°, θ, ψ) LN/glass structure substrate for KH which provides the maximum $K^2$.
Figure 6:
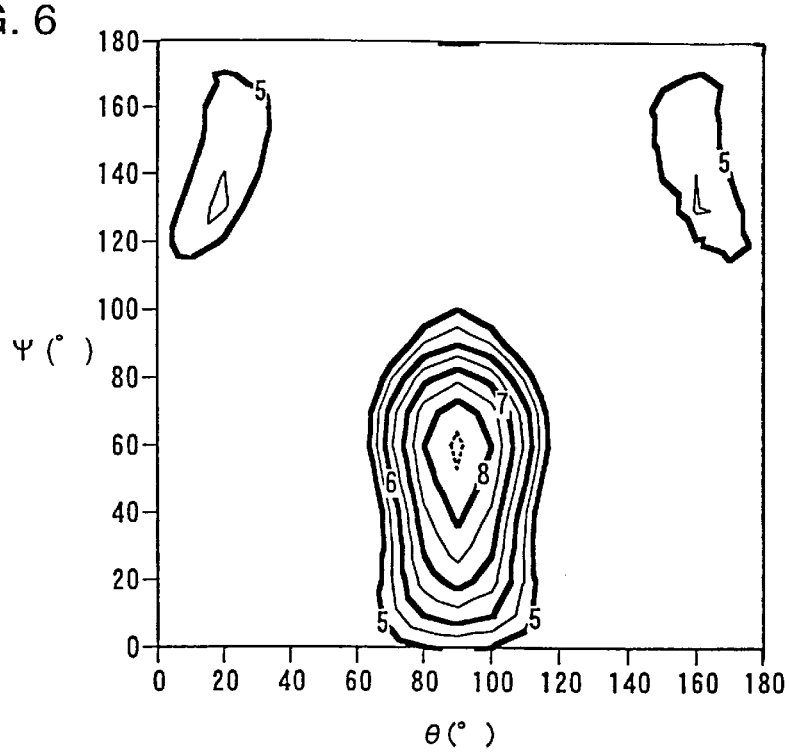
FIG. 6 is a graph illustrating the calculation result of $K^2$ of a (30°, θ, ψ) LN/glass structure substrate for KH which provides the maximum $K^2$.

Here, a parameter $\phi$ of Eulerian angle parameters ($\phi$, $\theta$, $\psi$) which indicate an orientation is varied to the four values of 0°, 10°, 20°, 30° and $\theta$ and $\psi$ are changed from 0° to 180° in each case. By a similar calculation, KH which provides the maximum value of $K^2$ in each orientation ($\phi$, $\theta$, $\psi$) is found, and the maximum value of $K^2$ is obtained by using the found value of KH. The calculation result is illustrated in FIGS. 3 to 6. In FIG. 3, $\phi$ is fixed at 0° and $\theta$ and $\psi$ are changed. In FIG. 4, $\phi$ is fixed at 10° and $\theta$ and $\psi$ are changed. In FIG. 5, $\phi$ is fixed at 20° and $\theta$ and $\psi$ are changed. In FIG. 6, $\phi$ is fixed at 30° and $\theta$ and $\psi$ are changed. In these figures, the maximum value of $K^2$ in each orientation is represented in contour. A number with a contour line is the maximum value of $K^2$ in its orientation.

Since the object of the present invention is to obtain an SAW device substrate having a larger value of $K^2$ than a conventional (0°, 38°, 0°) LN substrate, it is less significant to evaluate orientations which can attain only $K^2$ smaller than 5.2% that is the value of $K^2$ for the conventional substrate. Therefore, orientations which attain the values of $K^2$ smaller than 5% are not shown in FIGS. 3 to 6. In other words, portions with no contour lines correspond to the orientations which attain the values of $K^2$ smaller than 5% in FIGS. 3 to 6.

According to the calculation result, the maximum value of $K^2$ is as large as over 8% when the Eulerian angles of LN are in the range of (20°, 80–90°, 50–70°) in FIG. 5 and in the range of (30°, 80–100°, 35–75°) in FIG. 6. Above all, when the range is (30°, 90°, 60°), the maximum value of $K^2$ is as large as 8.7%.

Figure 7:
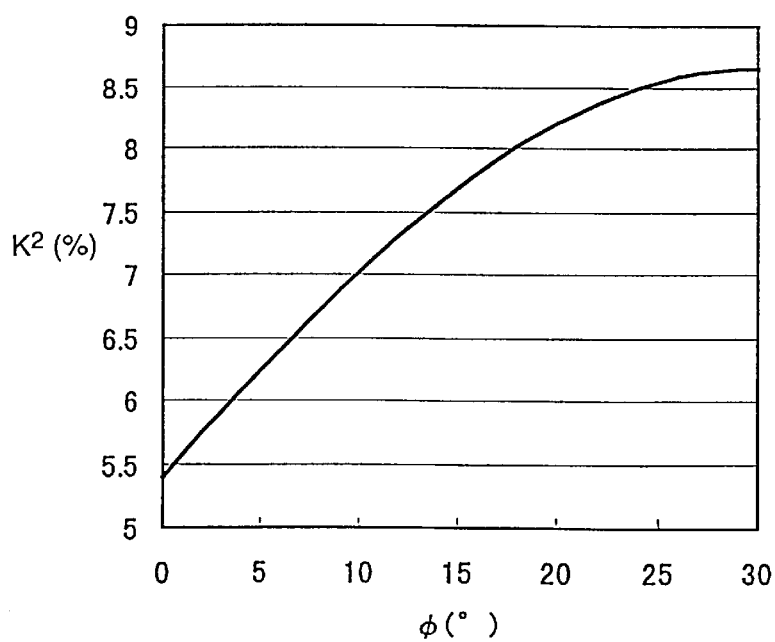
FIG. 7 is a graph illustrating the calculation result of $K^2$ of a (φ, 90°, 60°) LN/glass structure substrate for KH which provides the maximum $K^2$.

FIG. 7 illustrates the result of a similar calculation in the range of (0–30°, 90°, 60°). It can be seen from FIG. 7 that the maximum value of $K^2$ continuously changes in the range in which $\phi$ is 0–30°. Therefore, the maximum value of $K^2$ for $\phi$ other than when $\phi$=0°, 10°, 20°, 30° can also be predicted because of the continuity. Furthermore, the value of $K^2$ can be a large value close to 8.7% even if the range is not (0–30°, 90°, 60°) but it is (about 0–30°, about 90°, about 60°).

It can be seen from FIG. 7 that the maximum values of $K^2$ exceeds 8.0% in the range of 18°$\leq\phi$. Therefore, the Eulerian representation is preferably (18–30°, 80–100°, 35–75°).

From FIG. 7, the maximum value of $K^2$ is as large as over 8.5% in the range of 24°$\leq\phi$. Meanwhile, it can be seen from FIG. 6 that under the condition of $\phi$=30° the maximum value of $K^2$ is largest in the ranges of 88°$\leq\theta\leq$92° and 55°$\leq\psi\leq$65°. Therefore, the Eulerian representation is preferably (24–30°, 88–92°, 55–65°).

Figure 8:
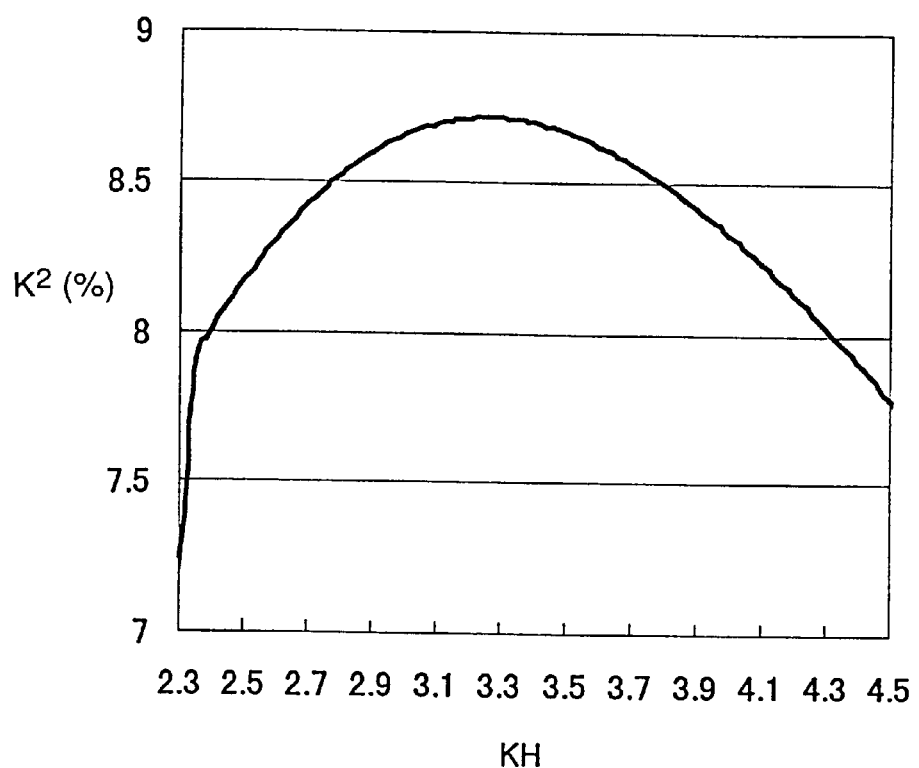
FIG. 8 illustrates the dependence of $K^2$ of a (30°, 90°, 60°) LN/glass structure substrate on KH when $2.3 \leq KH \leq 4.5$.

FIG. 8 illustrates the value of $K^2$, calculated in the range of 2.3$\leq$KH $\leq$4.5, when a (30°, 90°, 60°) LN is used. It can be seen from FIG. 8 that the value of $K^2$ exceeds 8% in the range of 2.4$\leq$KH$\leq$4.3. Above all, in the range of 2.8$\leq$KH$\leq$3.8, the value of $K^2$ exceeds 8.5%.

From the symmetrical nature of LN crystallinity, the calculation is performed only in the ranges of 0°$\leq\phi\leq$30°, 0°$\leq\theta\leq$180° and 0°$\leq\psi\leq$180°. Furthermore, the constants of glass used for calculation are those of glass generally used for electronic materials. Table 2 shows the constants of glass used for calculation.

TABLE 2

| Constants of Glass Used for Calculation | |
|---|---|
| density | 2.76 g/cm$^3$ |
| coefficient of thermal expansion | 46 × 10$^{-7}$° C. |
| dielectric constant | 5.8 |
| Young's modulus | 6.86 × 10$^3$ kg/mm$^2$ |
| Poisson's ratio | 0.28 |

As described above, an SAW device substrate having a larger value of $K^2$ than conventional cases can be obtained by using, as piezoelectric substrate 2, LN in the Eulerian angle ranges which were found out to be able to attain large $K^2$ or by determining the thickness of piezoelectric substrate 2 and the pitch of electrodes 3 so as to be included in the KH range which was found out to be able to attain large $K^2$. If designing is performed so that the Eulerian angle ranges and the KH range are satisfied simultaneously, the value of $K^2$ is made much larger and it is preferred.

As described above, according to the surface acoustic wave device in this embodiment, LN, which is expressed as (18–30°, 80–100°, 35–75°) in terms of Eulerian angles, is used and the thickness of piezoelectric substrate 2 and the pitch of electrodes 3 are determined so that KH is at least 2.3 and at most 4.5. Therefore, an SAW device substrate having the value of $K^2$ larger than that of conventional SAW device substrates can be obtained.

Second Embodiment

A schematic sectional view showing the structure of an SAW device in a second embodiment of the present invention is shown in FIG. 1. An SAW device 5 has a glass substrate 1, a piezoelectric substrate 2 and an electrode 3. The appearance is the same as the one in the first embodiment. In this embodiment, piezoelectric substrate 2 is formed on glass substrate 1 and is made of $Li_2B_4O_7$. On piezoelectric substrate 2 is formed electrode 3 which has an arrangement according to the device.

Such an SAW device substrate 6 can be obtained by bonding an $Li_2B_4O_7$ substrate as piezoelectric substrate 2 onto a surface of glass substrate 1 or forming an $Li_2B_4O_7$ thin film as piezoelectric substrate 2 on the surface of glass substrate 1 and, thereafter, forming and patterning electrode 3 on the $Li_2B_4O_7$ substrate (thin film) as piezoelectric substrate 2.

Glass substrate 1 may be made of a material such as quartz glass, aluminosilicate glass, borosilicate glass, soda lime glass and lead silicate glass. Piezoelectric substrate 2 may be made of only $Li_2B_4O_7$, and it may partially contain $Li_2B_4O_7$. The substrate to be combined with piezoelectric substrate 2 is not limited to a glass substrate, and it may be any material causing a lower sound speed than $Li_2B_4O_7$ and having an opposite sign characteristic from those of TCD and TCV (temperature coefficients of sound speed) of $Li_2B_4O_7$. The material for electrode 3 may be aluminum, for example, although not exclusive.

As shown in FIG. 1, the thickness of piezoelectric substrate 2 is H, the pitch of electrodes 3 is $\lambda$, and K is $2\pi/\lambda$. The following description will be provided by paying attention to the Eulerian angles of $Li_2B_4O_7$ included in piezoelectric substrate 2 as well as KH which is a product of K and H.

Figure 9:
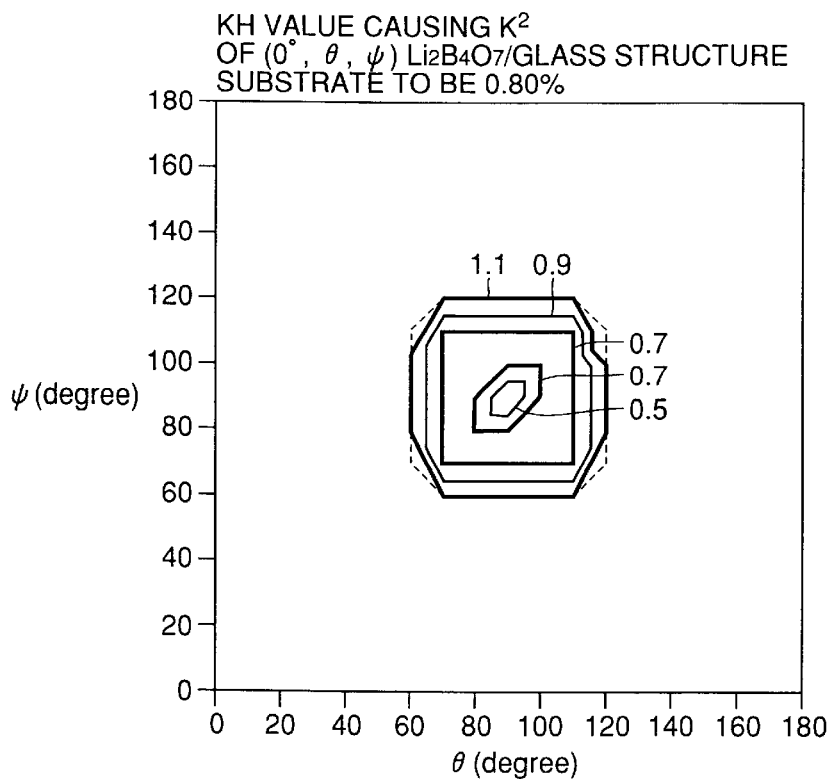
FIG. 9 is a graph illustrating the value of KH which causes $K^2$ of a (0°, θ, ψ) $Li_2B_4O_7$/glass structure substrate to be 0.80%.

Conventionally, a <110> $Li_2B_4O_7$ substrate is generally used as the $Li_2B_4O_7$ substrate. From Table 1, the value of $K^2$ in the <110> $Li_2B_4O_7$ substrate is 0.80%. FIG. 9 illustrates the result of calculating the value of KH in a (0°, θ, ψ) $Li_2B_4O_7$/glass structure substrate when $K^2$ is 0.80%, similarly to the case of the <110> $Li_2B_4O_7$ substrate. For the calculation, the Campbell and Jones method was employed. The range of calculated KH for $Li_2B_4O_7$ is $0 \leq KH \leq 3.0$. The interior of the dash line is a region where $K^2$ is 0.80% while the exterior of the dash line corresponds to an orientation in which $K^2$ is smaller than 0.80% in the calculation range of $0 \leq KH \leq 3.0$. In other words, it is where $K^2$ is at least 0.80% in the region of $60° \leq θ \leq 120°$ and $60° \leq ψ \leq 120°$.

Figure 10:
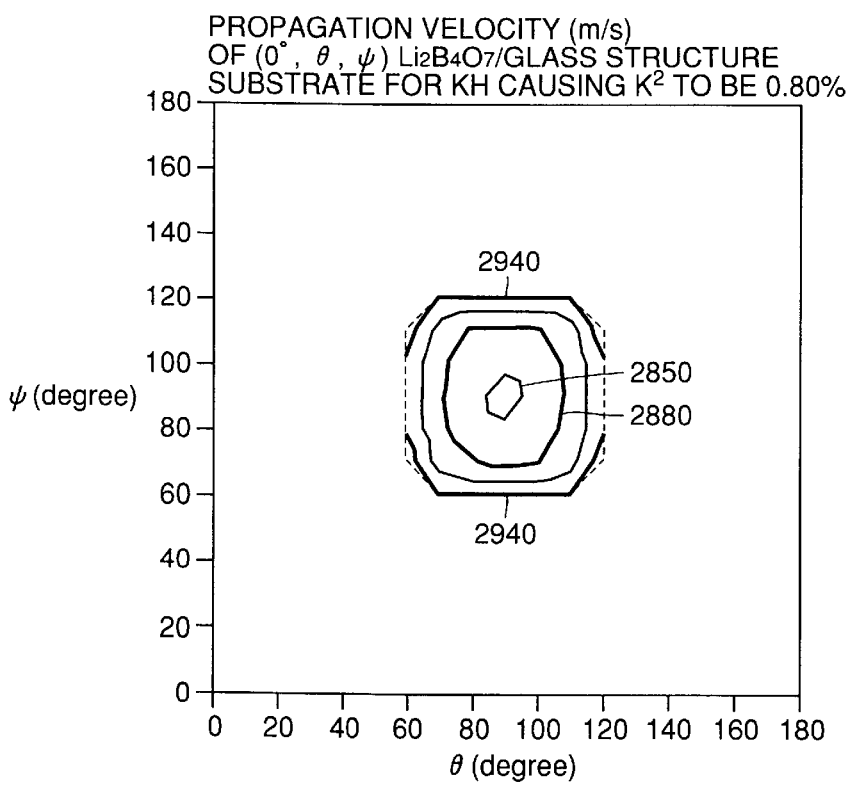
FIG. 10 is a graph illustrating the propagation velocity (m/s) of the (0°, θ, ψ) $Li_2B_4O_7$/glass structure substrate for the KH shown in FIG. 9.
Figure 11:
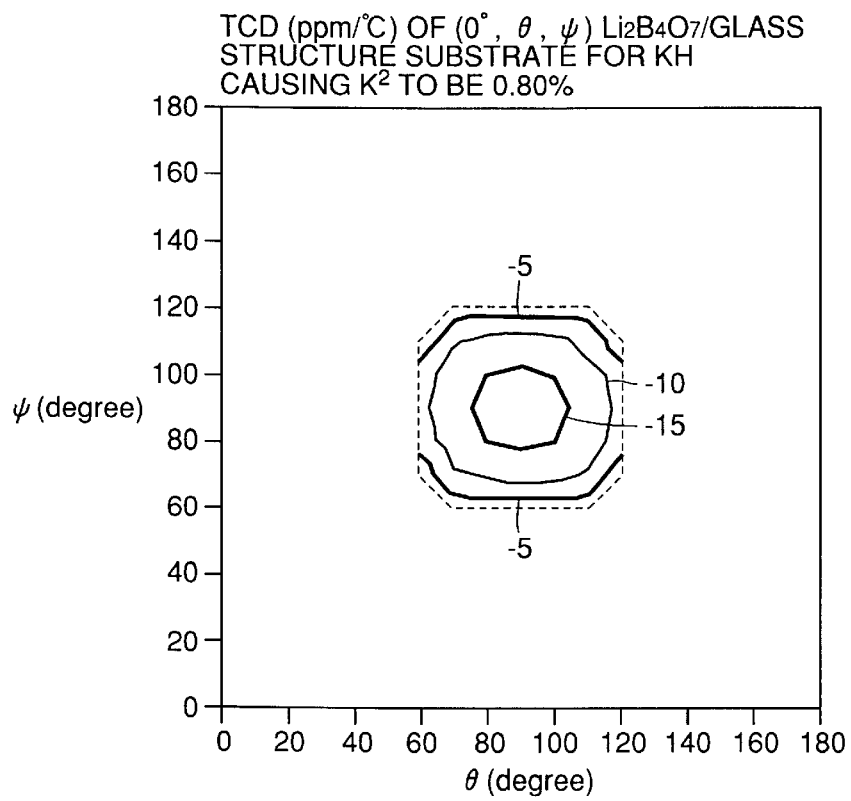
FIG. 11 is a graph illustrating the TCD (ppm/° C.) of the (0°, θ, ψ) $Li_2B_4O_7$/glass structure substrate for the KH shown in FIG. 9.

The results of calculating the propagation velocity and TCD for the value of KH shown in FIG. 9, that is, for KH when $K^2$ is 0.80% are illustrated in FIGS. 10 and 11, respectively. The constants of glass used for the calculation are those typically employed for electronic materials. The glass constants used for the calculation are as already shown in Table 2.

It can be seen from FIG. 10 that some Eulerian angles bring about a lower propagation velocity although $K^2$=0.80% as in the <110> $Li_2B_4O_7$ substrate. Particularly for (0°, 85–95°, 85–95°), the propagation velocity is about 2850 m/s. Since the propagation velocity on the <110> $Li_2B_4O_7$ substrate is 3465 m/s from Table 1, the propagation velocity on the (0°, 85–95°, 85–95°) $Li_2B_4O_7$ substrate is about 18% lower than on <110> $Li_2B_4O_7$ substrate. Since the propagation velocity is lower, the Eulerian angles (0°, 85–95°, 85–95°) can be regarded as a superior orientation. The value of KH for the Eulerian angles is about 0.5 from FIG. 9. The value of TCD for the Eulerian angles is –15.1 from the calculation result (see FIG. 11).

Figure 12:
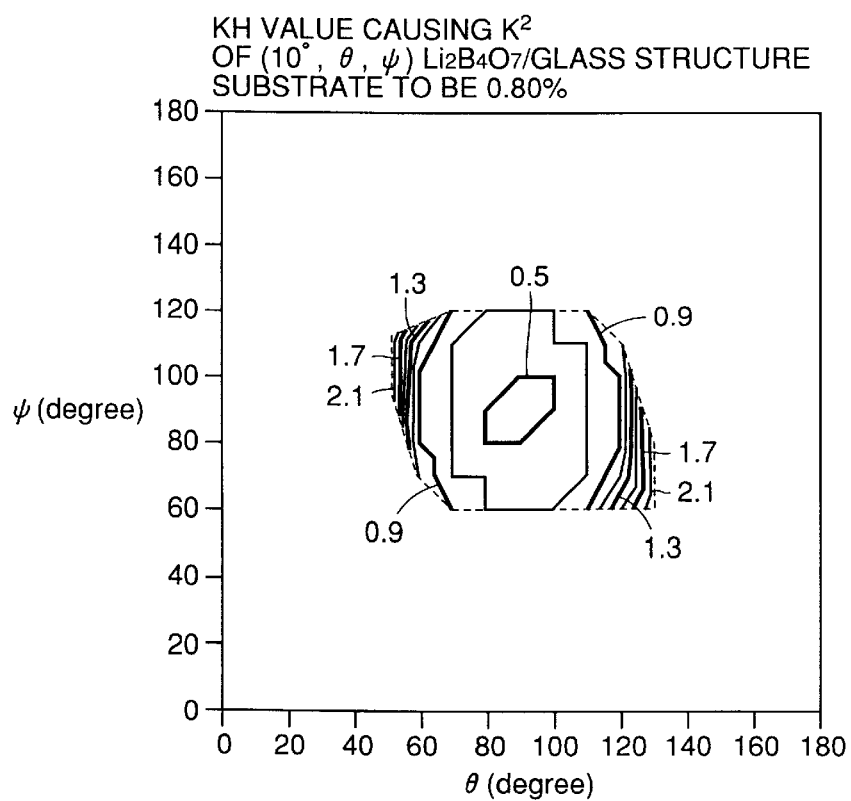
FIG. 12 is a graph illustrating the value of KH which causes $K^2$ of a (10°, θ, ψ) $Li_2B_4O_7$/glass structure substrate to be 0.80%.
Figure 13:
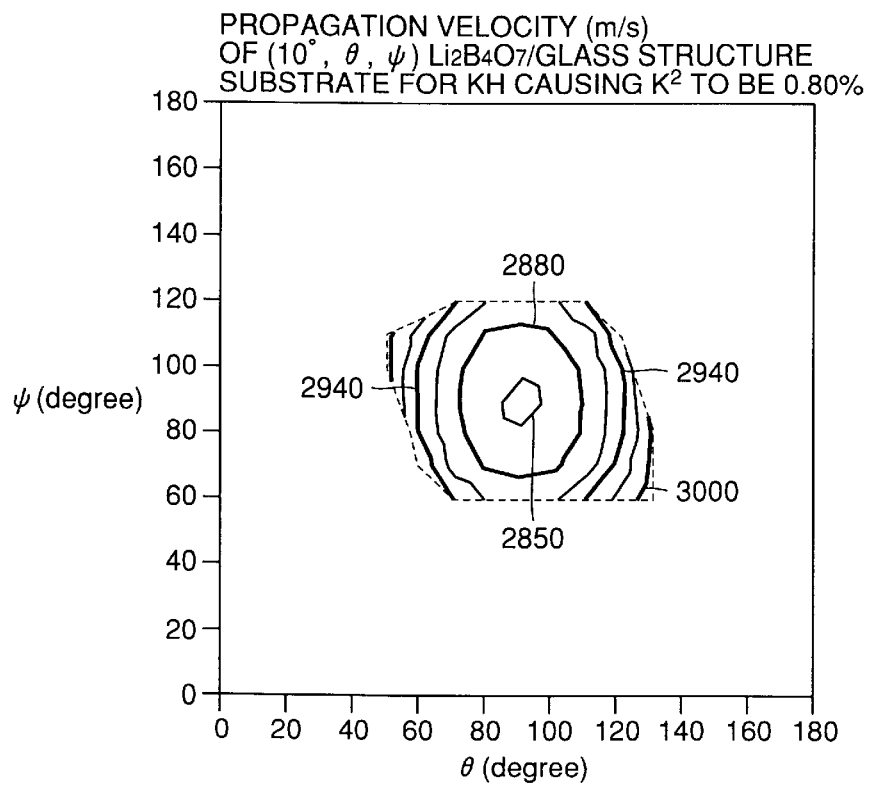
FIG. 13 is a graph illustrating the propagation velocity (m/s) of the (10°, θ, ψ) $Li_2B_4O_7$/glass structure substrate for the KH shown in FIG. 12.
Figure 14:
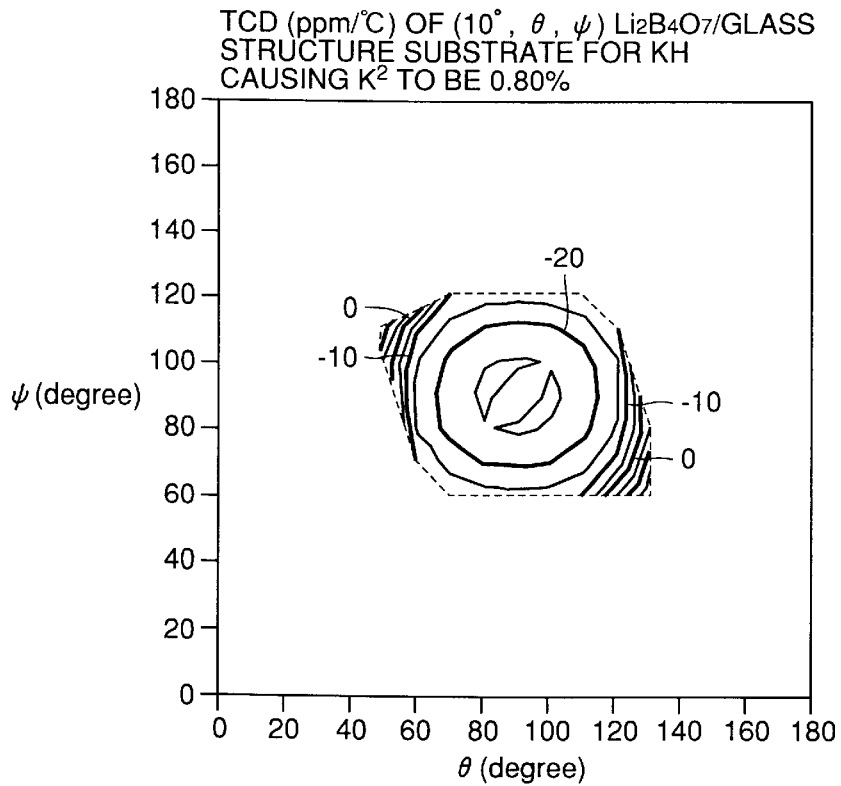
FIG. 14 is a graph illustrating the TCD (ppm/° C.) of the (10°, θ, ψ) $Li_2B_4O_7$/glass structure substrate for the KH shown in FIG. 12.
Figure 15:
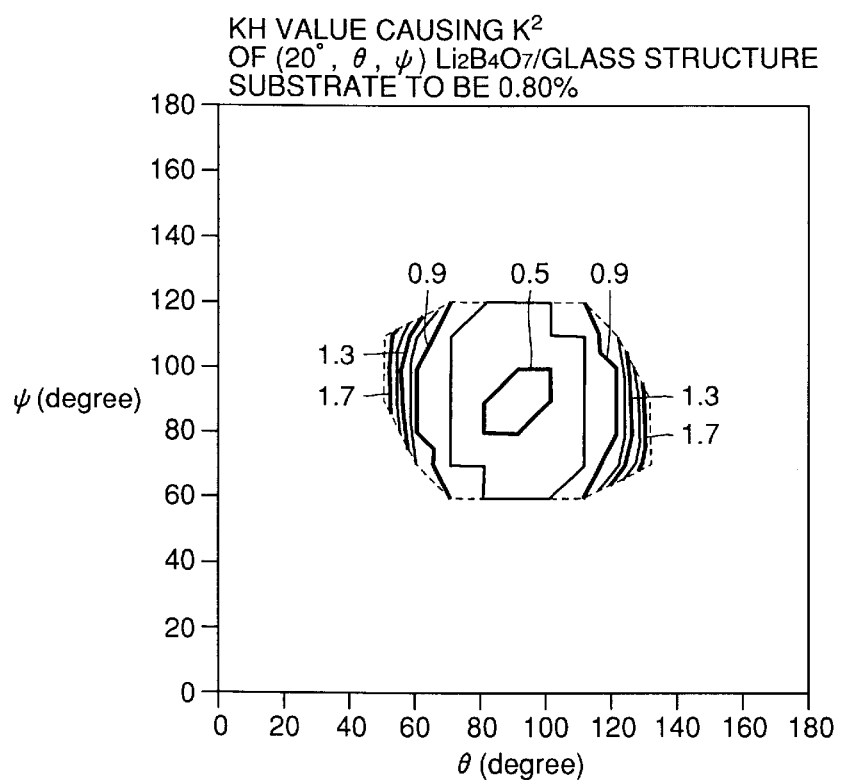
FIG. 15 is a graph illustrating the value of KH which causes $K^2$ of a (20°, θ, ψ) $Li_2B_4O_7$/glass structure substrate to be 0.80%.
Figure 16:
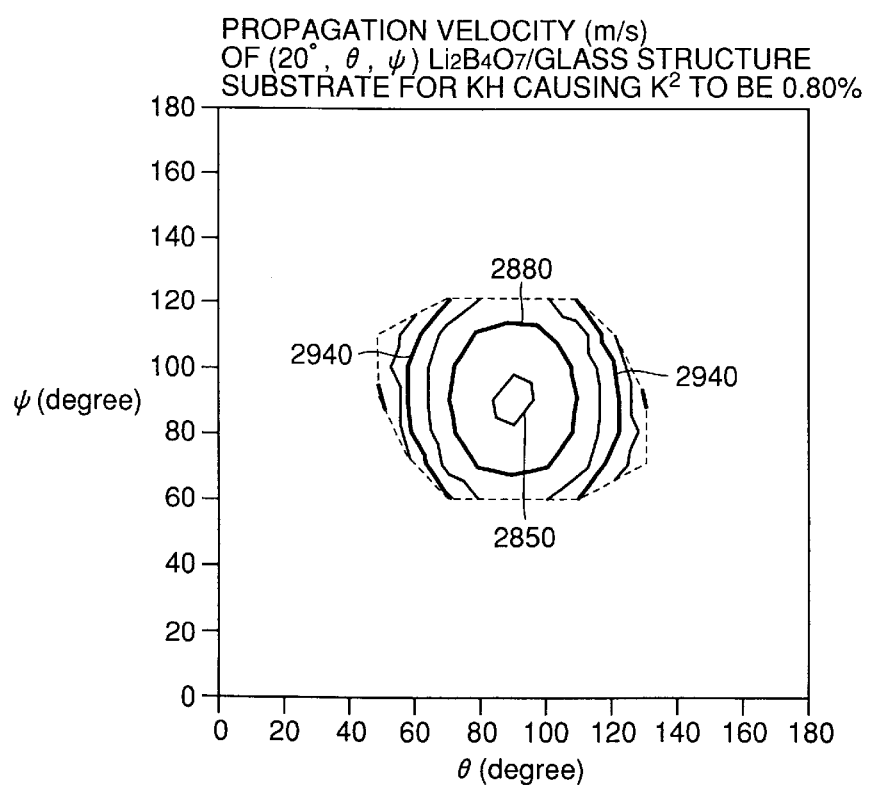
FIG. 16 is a graph illustrating the propagation velocity (m/s) of the (20°, θ, ψ) $Li_2B_4O_7$/glass structure substrate for the KH shown in FIG. 15.
Figure 17:
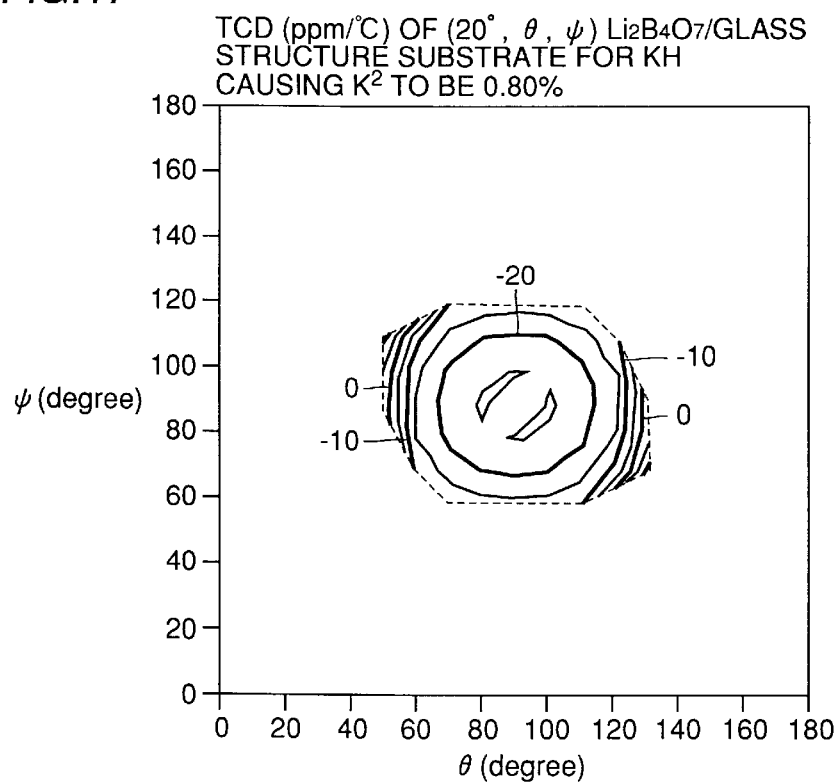
FIG. 17 is a graph illustrating the TCD (ppm/° C.) of the (20°, θ, ψ) $Li_2B_4O_7$/glass structure substrate for the KH shown in FIG. 15.
Figure 18:
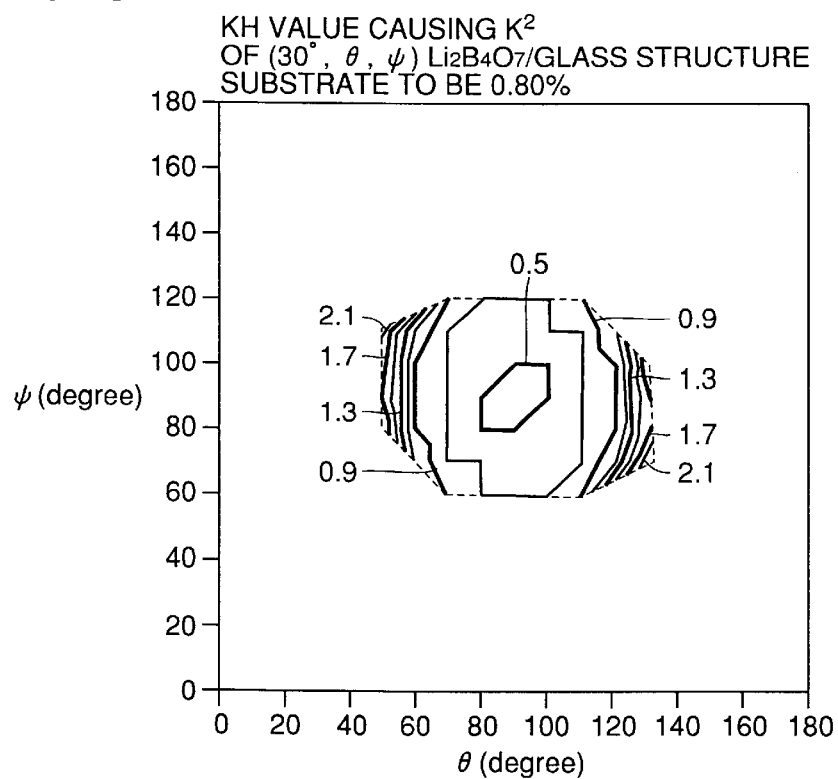
FIG. 18 is a graph illustrating the value of KH which causes $K^2$ of a (30°, θ, ψ) $Li_2B_4O_7$/glass structure substrate to be 0.80%.
Figure 19:
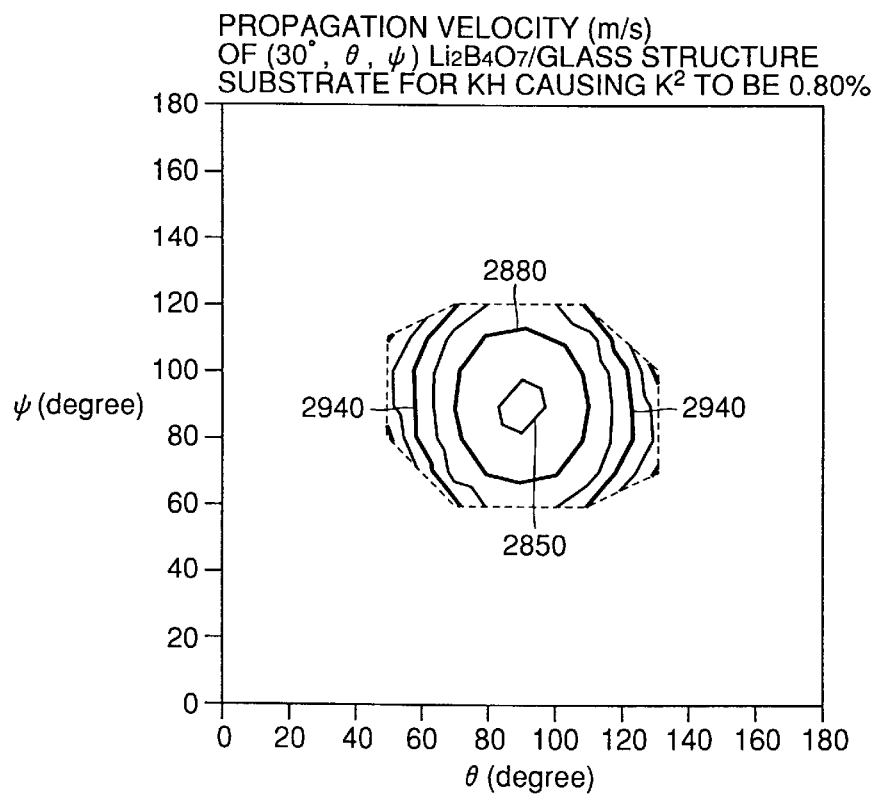
FIG. 19 is a graph illustrating the propagation velocity (m/s) of the (30°, θ, ψ) $Li_2B_4O_7$/glass structure substrate for the KH shown in FIG. 18.
Figure 20:
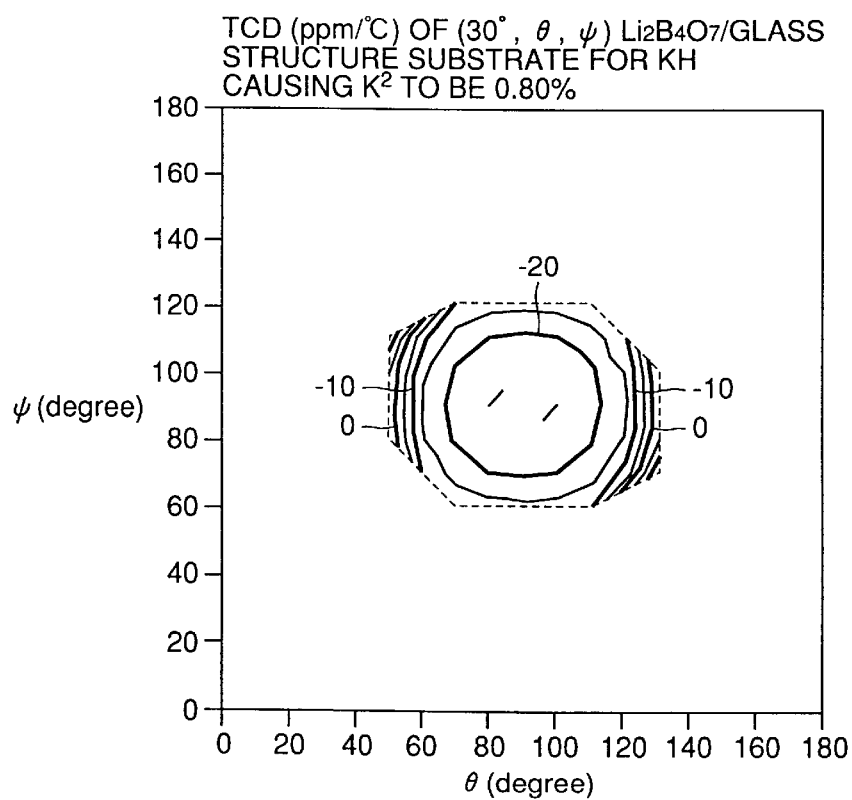
FIG. 20 is a graph illustrating the TCD (ppm/° C.) of the (30°, θ, ψ) $Li_2B_4O_7$/glass structure substrate for the KH shown in FIG. 18.
Figure 21:
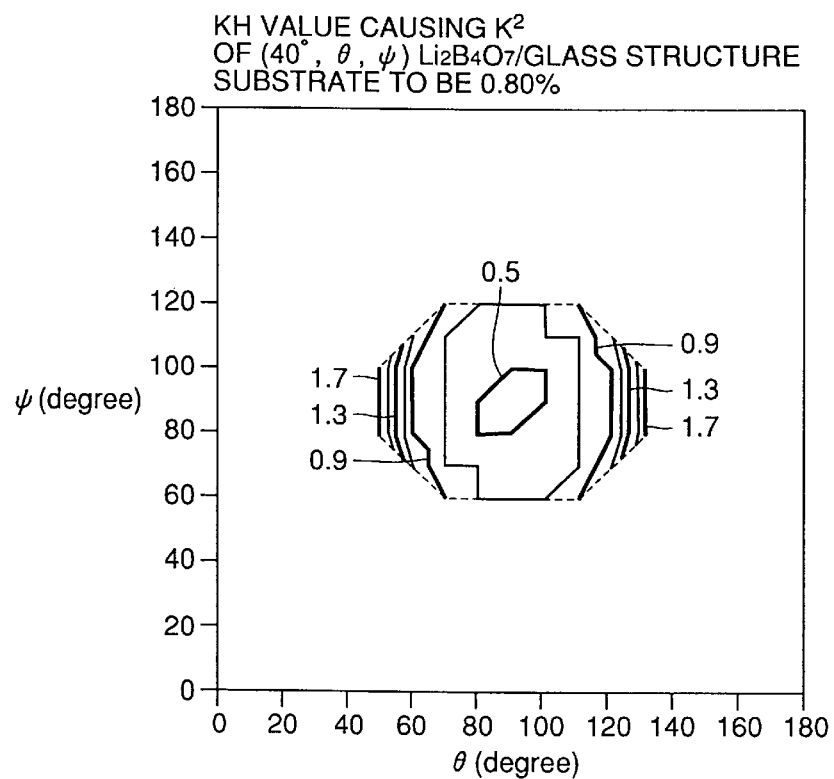
FIG. 21 is a graph illustrating the value of KH which causes $K^2$ of a (40°, θ, ψ) $Li_2B_4O_7$/glass structure substrate to be 0.80%.
Figure 22:
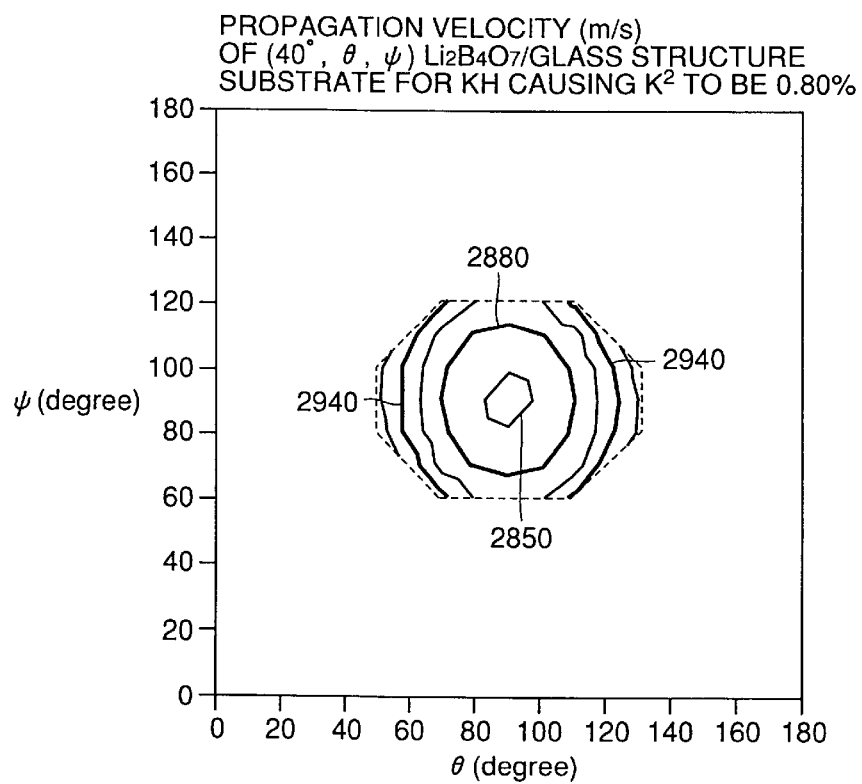
FIG. 22 is a graph illustrating the propagation velocity (m/s) of the (40°, θ, ψ) $Li_2B_4O_7$/glass structure substrate for the KH shown in FIG. 21.
Figure 23:
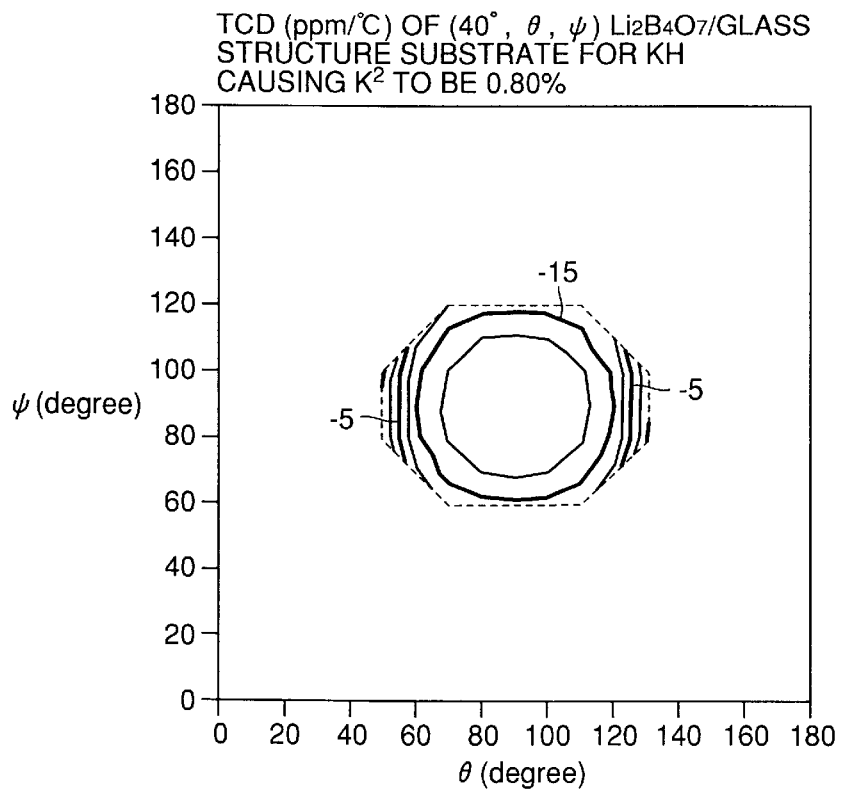
FIG. 23 is a graph illustrating the TCD (ppm/° C.) of the (40°, θ, ψ) $Li_2B_4O_7$/glass structure substrate for the KH shown in FIG. 21.
Figure 24:
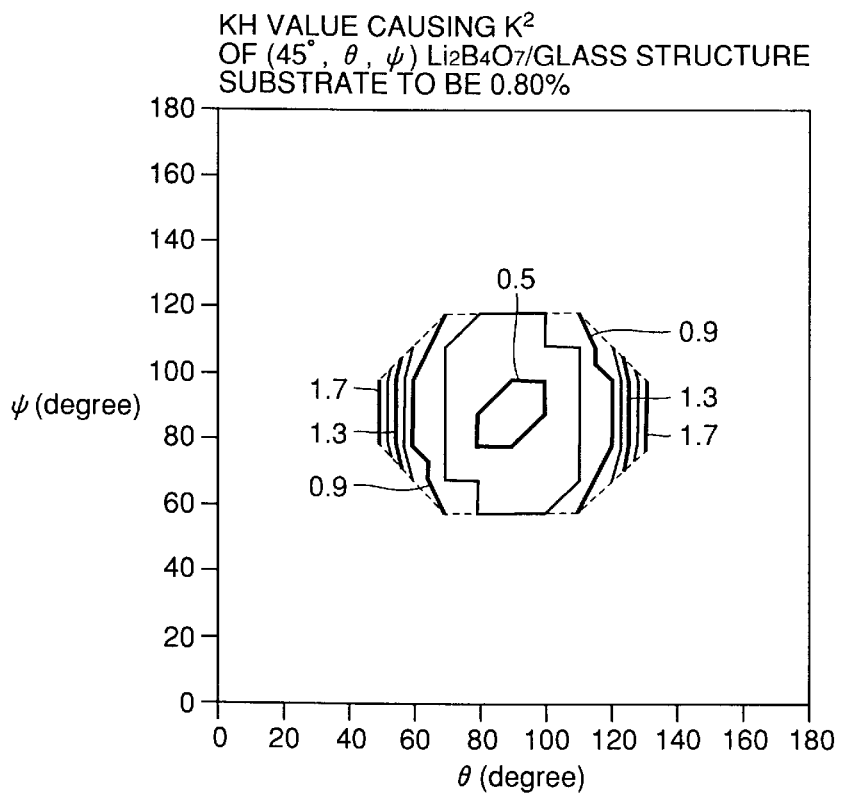
FIG. 24 is a graph illustrating the value of KH which causes $K^2$ of a (45°, θ, ψ) $Li_2B_4O_7$/glass structure substrate to be 0.80%.
Figure 25:
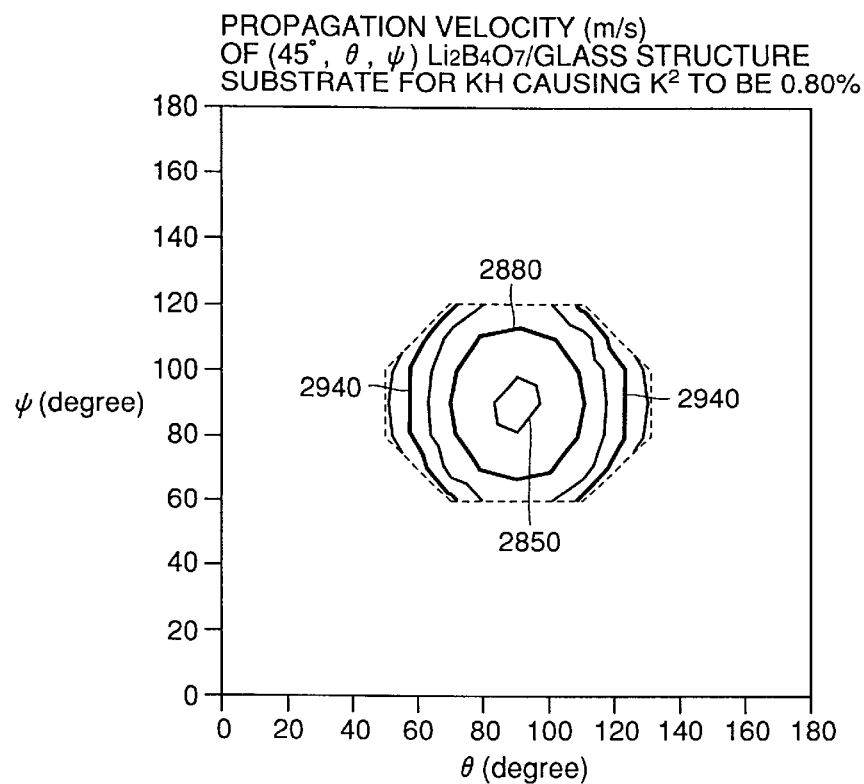
FIG. 25 is a graph illustrating the propagation velocity (m/s) of the (45°, θ, ψ) $Li_2B_4O_7$/glass structure substrate for the KH shown in FIG. 24.
Figure 26:
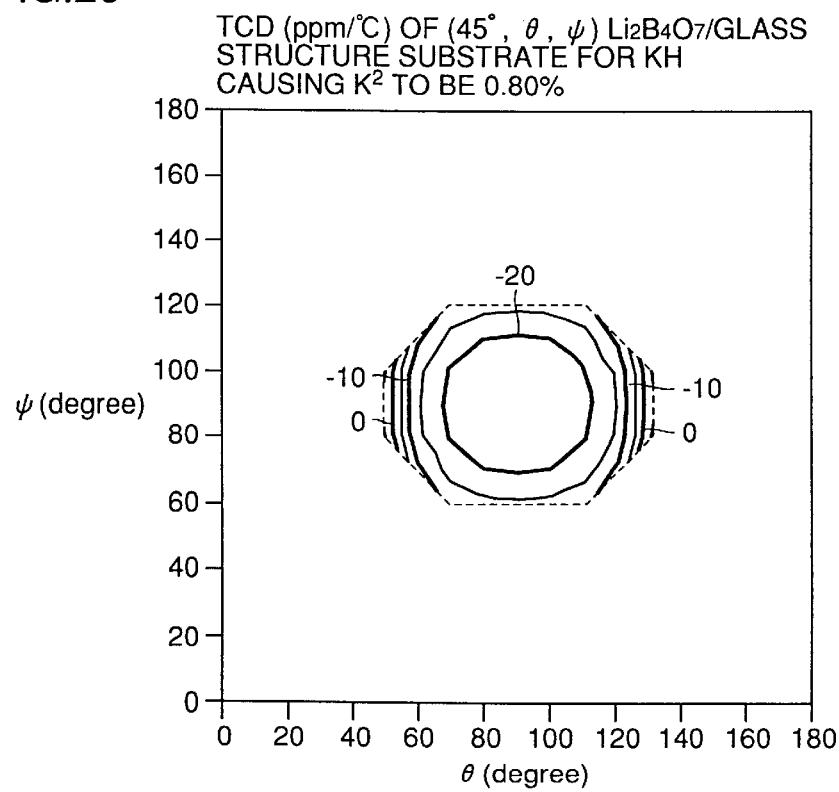
FIG. 26 is a graph illustrating the TCD (ppm/° C.) of the (45°, θ, ψ) $Li_2B_4O_7$/glass structure substrate for the KH shown in FIG. 24.

Similarly, a parameter φ of the Eulerian parameters (φ, θ, ψ) indicating an orientation is fixed at 10° and θ, ψ are changed, and the result of calculating the value of KH when $K^2$ is 0.80% is illustrated in FIG. 12. Similarly, the propagation velocity and the TCD are illustrated in FIGS. 13 and 14, respectively. Similarly, the cases where φ is fixed at 20° are illustrated in FIGS. 15 to 17. Similarly, the cases where φ is fixed at 30° are illustrated in FIGS. 18 to 20. Similarly, the cases where φ is fixed at 40° are illustrated in FIGS. 21 to 23. Similarly, the cases where φ is fixed at 45° are illustrated in FIGS. 24 to 26. For each of φ=10°, 20°, 30°, 40° and 45°, (φ, 85–95°, 85–95°) and (0, 85–95°, 85–95°) have a similar propagation velocity. Therefore, by using an SAW device substrate provided by forming $Li_2B_4O_7$ having Eulerian angles of (0–45°, 85–95°, 85–95°) and particularly KH=5 on a glass substrate surface, it becomes possible to manufacture an SAW filter that is smaller than the SAW device employing the conventionally used <110> $Li_2B_4O_7$.

From the symmetrical property of an $Li_2B_4O_7$ crystal, the calculation was performed only in the ranges of $0° \leq φ \leq 45°$, $0° \leq θ \leq 180°$ and $0° \leq ψ \leq 180°$.

An implementation of the SAW device substrate in the second embodiment of the present invention used for an SAW filter will be described. A sectional view of the SAW filter as an example of SAW device 5 using the SAW device substrate is shown in FIG. 1. A glass substrate 1 having the material constants shown in Table 2 and a (0°, 90°, 90°) $Li_2B_4O_7$ substrate with a thickness of 6 μm as a piezoelectric substrate 2 are stacked by a direct bonding technique, and an electrode 3 is formed on a surface of the $Li_2B_4O_7$ substrate as piezoelectric substrate 2. Here, the direct bonding technique is a technique of directly bonding the substrates without providing an adhesion layer therebetween. Specifically, a polished and cleaned glass substrate 1 and the $Li_2B_4O_7$ substrate as piezoelectric substrate 2 are hydrophilized by an ammonia aqueous solution, and thereafter the substrates are overlapped each other and bonded together by a hydrogen bond. In this implementation, heat treatment is provided after the bonding process to increase the bonding strength. An aluminum film with a thickness of 1000 Å is formed on thus obtained $Li_2B_4O_7$/glass structured SAW device substrate 6 by sputtering, and the electrode is patterned by photolithography. An SAW filter as a kind of SAW device 5 is obtained by the foregoing steps.

Figure 27:
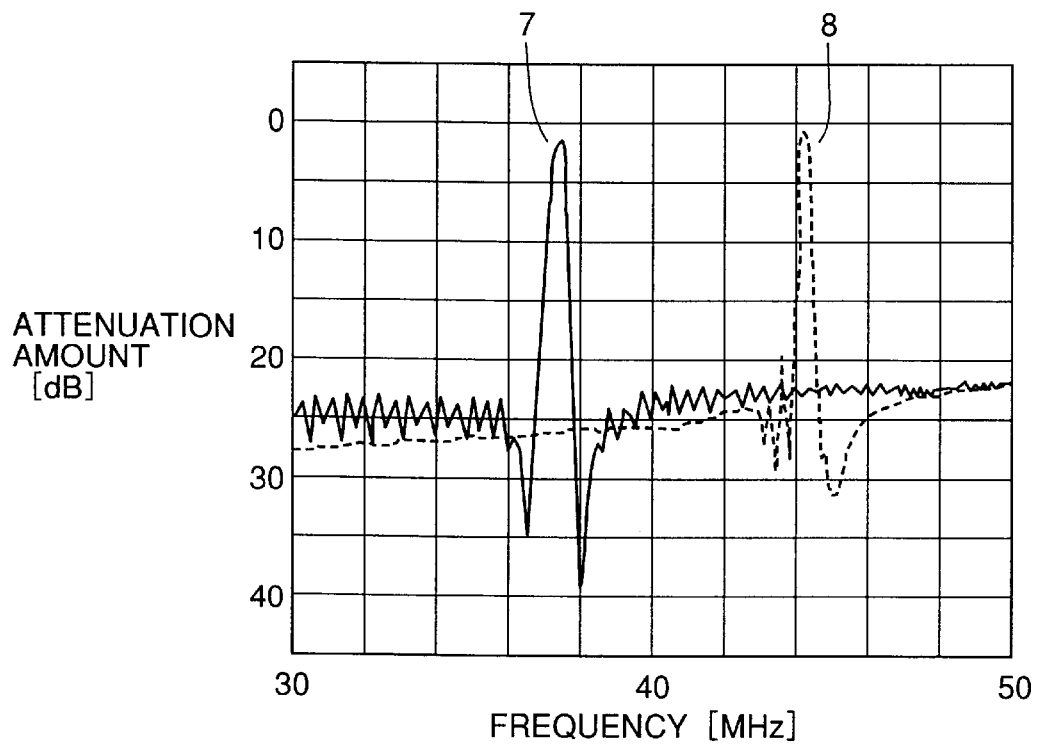
FIG. 27 is a graph illustrating the frequency characteristics of SAW filters using a <110> $Li_2B_4O_7$ substrate and an $Li_2B_4O_7$/glass structure substrate.
Figure 28:
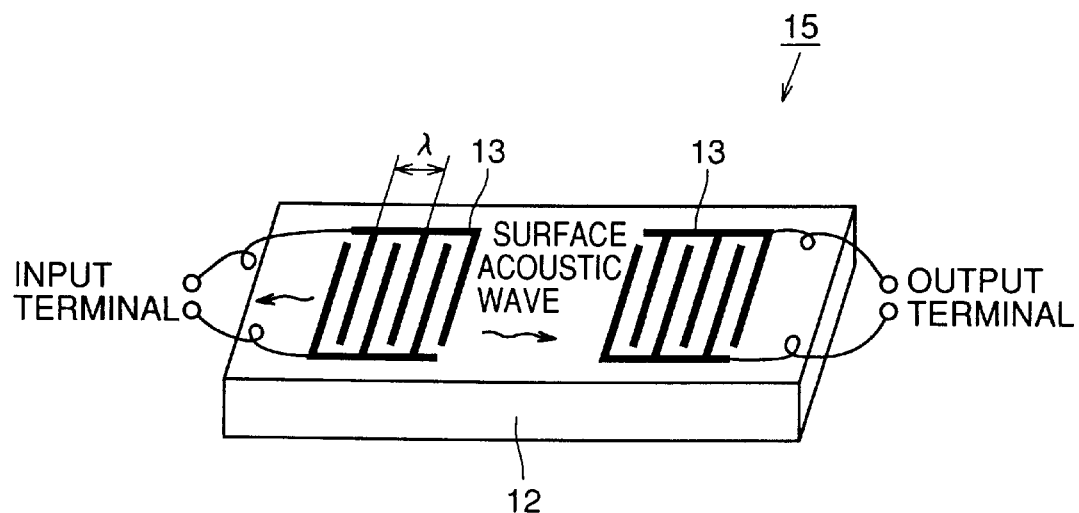
FIG. 28 is a perspective view showing the structure of a general SAW filter according to the conventional art.
Figure 29:
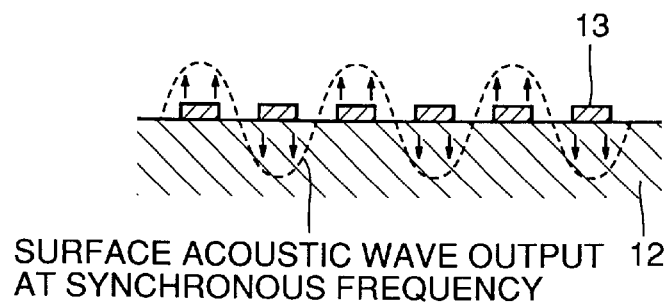
FIG. 29 is a view for illustrating an operation of the SAW filter shown in FIG. 28.
Figure 30:
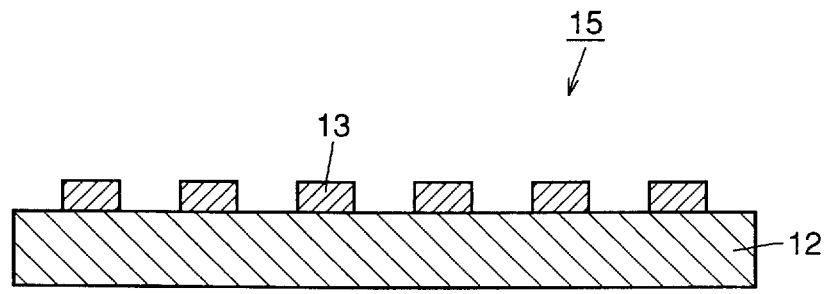
FIG. 30 is a sectional view schematically showing the structure of an SAW device according to the conventional art.
Figure 31:
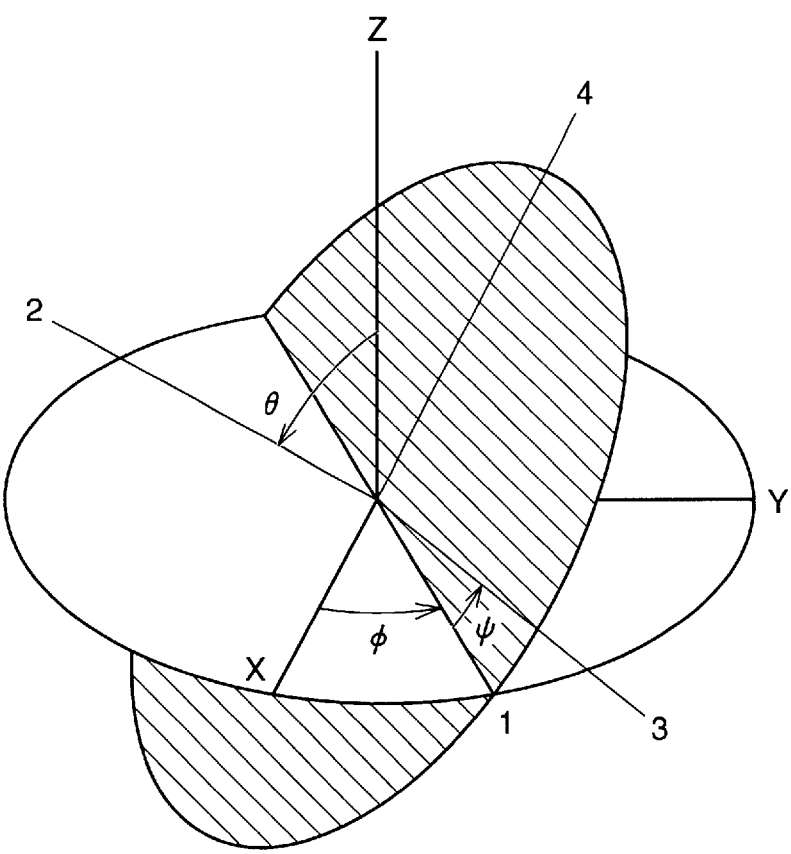
FIG. 31 is a view for illustrating Eulerian angles.

FIG. 27 illustrates comparison between the frequency characteristics of SAW filters on which electrodes designed by the same parameter are respectively formed on the <110> $Li_2B_4O_7$ substrate and $Li_2B_4O_7$/glass structured SAW device substrate 6 in the second embodiment of the present invention. In FIG. 27, the frequency characteristics 7 of the SAW filter using the $Li_2B_4O_7$/glass substrate according to the present invention are indicated by the solid line, and the frequency characteristics 8 of the SAW filter using the <110> $Li_2B_4O_7$ substrate are indicated by the dash line. Here, the pitch of electrodes are set at 5.2 μm to attain KH=0.5. It can be appreciated from FIG. 27 that comparison between the frequency characteristics indicate substantially different resonant frequencies. This is because the propagation velocity of the SAW filter according to the present invention is lower than the propagation velocity of the conventional SAW filter using the <110> $Li_2B_4O_7$ substrate. In order for the SAW filter according to the present invention to have the same frequency band as the conventional SAW filter, the electrode pitch needs to be made smaller. That makes it possible to attain a smaller filter. When the characteristics in the pass bands are compared, it can be understood that the SAW filter according to the present invention does not exhibit any problem with the insertion loss and the pass band width and has the value of $K^2$ similar to that of the conventional SAW filter.

As described above, according to surface acoustic wave device 5 in this embodiment, piezoelectric substrate 2, which includes $Li_2B_4O_7$ expressed as (0–45°, 85–95', 85–95°) in terms of Eulerian angles, is used as piezoelectric substrate 2, and the thickness of piezoelectric substrate 2 and the pitch of electrodes 3 are determined so that KH is about 0.5. Therefore, the propagation velocity can be made lower than that of the SAW device substrate employing the conventional <110> $Li_2B_4O_7$ substrate. Since the pitch of electrodes 3 can be made smaller as a result, it is advantageous for attaining a smaller SAW device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A substrate for a surfce acoustic wave device, comprising a glass substrate, and a piezoelectric substrate including $LiNbO_3$ formed on said glass substrate, wherein said $LiNbO_3$ is represented by Eulerian angles of (24–30°, 88–92°, 55–65°).

2. The substrate for a surface acoustic wave device according to claim 1, wherein said $LiNbO_3$ is represented by Eulerian angles of (about 30°, about 90°, about 60°).

3. A surface acoustic wave device, comprising a substrate for a surface acoustic wave device having a glass substrate and a piezoelectric substrate including $LiNbO_3$ formed on said glass substrate, said $LiNbO_3$ being represented by Eulerian angles of (18–30°, 80–100°, 35–75°), and an electrode formed on said piezoelectric substrate, wherein a product of K and H is at least 2.3 and at most 4.5 in which $\lambda$ is a pitch of said electrode, H is a thickness of said piezoelectric substrate, and K is $2\pi/\lambda$.

4. The surface acoustic wave device according to claim 3, wherein a product of K and H is at least 2.8 and at most 3.8.

5. A surface acoustic wave device, comprising a substrate for a surface acoustic wave device having a glass substrate and a piezoelectric substrate including $LiNbO_3$ formed on said glass substrate, said $LiNbO_3$ being represented by Eulerian angles of (24–30°, 88–92°, 55–65°), and an electrode formed on said piezoelectric substrate, wherein a product of K and H is at least 2.3 and at most 4.5 in which $\lambda$ is a pitch of said electrode, H is a thickness of said piezoelectric substrate, and K is $2\pi/\lambda$.

6. The surface acoustic wave device according to claim 5, wherein a product of K and H is at least 2.8 and at most 3.8.

7. A surface acoustic wave device, comprising a substrate for a surface acoustic wave device having a glass substrate and a piezoelectric substrate including $LiNbO_3$ formed on said glass substrate, said $LiNbO_3$ being represented by Eulerian angles of (about 30°, about 90°, about 60°), and an electrode formed on said piezoelectric substrate, wherein a product of K and H is at least 2.3 and at most 4.5 in which $\lambda$ is a pitch of said electrode, H is a thickness of said piezoelectric substrate, and K is $2\pi/\lambda$.

8. The surface acoustic wave device according to claim 7, wherein a product of K and H is at least 2.8 and at most 3.8.

9. A surface acoustic wave device, comprising an electrode formed on a substrate for a surface acoustic wave device having a glass substrate and a piezoelectric substrate including $Li_2B_4O_7$ formed on said glass substrate, said $Li_2B_4O_7$ being represented by Eulerian angles of (0–45°, 85–95°, 85–95°), wherein a product of K and H is about 0.5 in which $\lambda$ is a pitch of said electrode, H is a thickness of said piezoelectric substrate, and K is $2\pi/\lambda$.

* * * * *